United States Patent
Leobandung et al.

(10) Patent No.: US 11,355,401 B1
(45) Date of Patent: Jun. 7, 2022

(54) FIELD EFFECT TRANSISTOR

(71) Applicant: International Business Machines Corporation, Armonk, NY (US)

(72) Inventors: Effendi Leobandung, Stormville, NY (US); Veeraraghavan S. Basker, Schenectady, NY (US); Junli Wang, Slingerlands, NY (US); Albert Chu, Nashua, NH (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/173,356

(22) Filed: Feb. 11, 2021

(51) Int. Cl.
*H01L 21/8238* (2006.01)
*H01L 27/092* (2006.01)

(52) U.S. Cl.
CPC .......... *H01L 21/823878* (2013.01); *H01L 21/823814* (2013.01); *H01L 27/092* (2013.01)

(58) Field of Classification Search
CPC ..... H01L 21/823878; H01L 21/823814; H01L 27/092
See application file for complete search history.

(56) References Cited

U.S. PATENT DOCUMENTS

| | | | |
|---|---|---|---|
| 8,658,486 B2 | 2/2014 | Aquilino et al. | |
| 9,281,382 B2 | 3/2016 | Liu et al. | |
| 9,437,679 B2 | 9/2016 | Adam et al. | |
| 9,589,847 B1 | 3/2017 | Chi et al. | |
| 9,601,570 B1 | 3/2017 | Radens et al. | |
| 9,710,589 B2 | 7/2017 | Dave et al. | |
| 10,056,289 B1 | 8/2018 | Cheng et al. | |
| 10,658,506 B2 | 5/2020 | Park et al. | |
| 2013/0313647 A1* | 11/2013 | Aquilino | H01L 21/823814 438/296 |

OTHER PUBLICATIONS

Kuang et al., "CRMA: Incorporating Cut Redistribution With Mask Assignment to Enable the Fabrication of 1-D Gridded Design," IEEE Transactions on Computer-Aided Design of Integrated Circuits and Systems, vol. 37, No. 10, 2017, pp. 2036-2049.

* cited by examiner

*Primary Examiner* — Karen Kusumakar
*Assistant Examiner* — Adam S Bowen
(74) *Attorney, Agent, or Firm* — Jeffrey M. Ingalls

(57) ABSTRACT

A method of forming a field effect transistor (FET) includes providing a substrate; forming an nFET source/drain region on the substrate; forming a pFET source/drain region on the substrate and adjacent to the nFET region, the nFET source/drain region directly contacting the pFET source/drain region; forming a first insulator layer on the nFET source/drain region and the pFET source/drain region; etching away a portion of the first insulator layer between the nFET source/drain region and the pFET source/drain region down to a level of the substrate, thereby breaking the contact between the nFET source/drain region and the pFET source/drain region; and forming a second insulator layer between the nFET source/drain region and the pFET source/drain region in a space formed by the etching, the second insulator layer extending from the substrate to a top of the first insulator layer. The second insulator layer is harder than the first insulator layer.

20 Claims, 20 Drawing Sheets

FIELD EFFECT TRANSISTOR

BACKGROUND

The present disclosure relates to fabrication methods and resulting structures for semiconductor devices. More specifically, the present disclosure relates to fabrication methods and resulting structures for field effect transistors (FETs).

In certain semiconductor device fabrication processes, a large number of semiconductor devices, such as n-type field effect transistors (nFETs) and p-type field effect transistors (pFETs), may be fabricated on a single wafer. Non-planar transistor device architectures (e.g., fin-type FETs (FinFETs) and nanosheet FETs) can provide increased device density and increased performance over planar transistors. Other FET devices may have adjacent nFET and pFET regions, which may take up additional space. As semiconductor integrated circuits (ICs) and/or chips become smaller, it may be desirable to reduce the device footprint and increase the density of the devices.

SUMMARY

Embodiments of the present disclosure relate to a method of forming a field effect transistor (FET) device. The method includes providing a substrate; forming an nFET source/drain region on the substrate; forming a pFET source/drain region on the substrate and adjacent to the nFET region, the nFET source/drain region directly contacting the pFET source/drain region; forming a first insulator layer on the nFET source/drain region and the pFET source/drain region; etching away a portion of the first insulator layer between the nFET source/drain region and the pFET source/drain region down to a level of the substrate, thereby breaking the contact between the nFET source/drain region and the pFET source/drain region; and forming a second insulator layer between the nFET source/drain region and the pFET source/drain region in a space formed by the etching, the second insulator layer extending from the substrate to a top of the first insulator layer. A material of the second insulator layer is harder than a material of the first insulator layer.

Other embodiments relate to a field effect transistor (FET) device. The device includes a substrate; an nFET source/drain region formed on the substrate; a pFET source/drain region formed on the substrate and adjacent to the nFET region; a first insulator layer formed on sides of the nFET source/drain region and the pFET source/drain region; and a second insulator layer formed between the nFET source/drain region and the pFET source/drain region, the second insulator layer extending from the substrate to a top of the first insulator layer. A material of the second insulator layer is harder than a material of the first insulator layer.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1A:
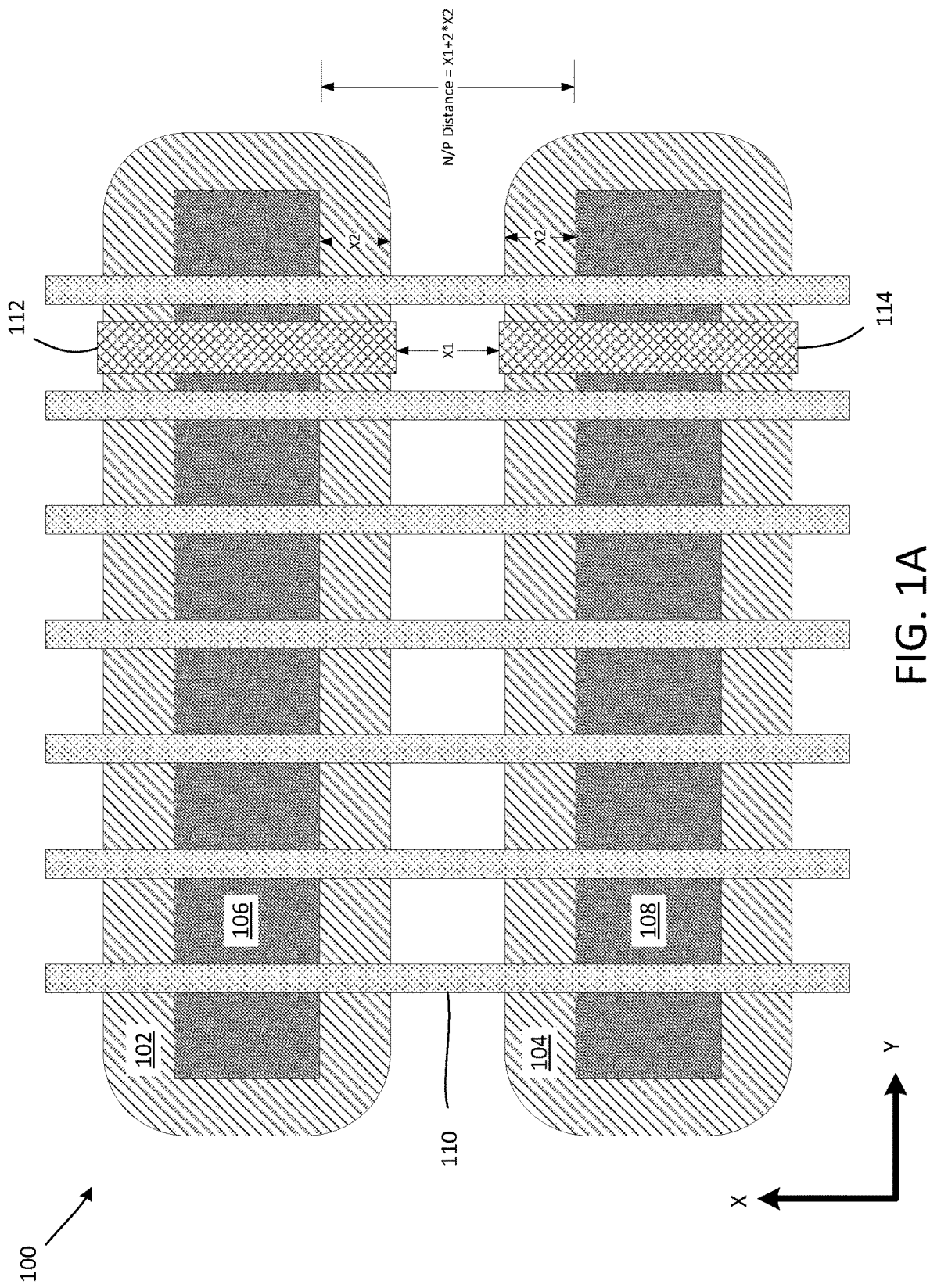
FIG. 1A is a plan view of a semiconductor FET device at an intermediate stage of a semiconductor fabrication process flow, according to embodiments.

The present disclosure describes FET devices and methods of manufacturing the FET devices. In particular, the present disclosure describes FET devices that are manufactured with a single cut (or etching operation) through the contact (CA) layer (or gate metal layer) and through the source/drain epitaxial region, which may allow for a reduction in the distance between the nFET side and the pFET side of the FET device. This may result in a decreased pitch and overall footprint of the device, which may allow for an increased density of the FET devices.

The flowcharts and cross-sectional diagrams in the Figures illustrate methods of manufacturing FET devices according to various embodiments. In some alternative implementations, the manufacturing steps may occur in a different order that that which is noted in the Figures, and certain additional manufacturing steps may be implemented between the steps noted in the Figures. Moreover, any of the layered structures depicted in the Figures may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Referring now to the drawings in which like numerals represent the same or similar elements and initially to FIG. 1A, a plan view of an example field effect transistor (FET) device 100 is shown at an intermediate stage of the manufacturing process. As shown in FIG. 1, a first epitaxial layer 102 is provided, and an nFET active region 106 is provided below the first epitaxial layer 102. Also, a second epitaxial layer 104 is provided, and a pFET active region 108 is provided below the second epitaxial layer 104. Gate electrodes 110 are provided that extend across the first epitaxial layer 102 and the second epitaxial layer 104. Also, a nFET contact 112 is provided across the first epitaxial layer 102 and a pFET contact 114 is provided across the second epitaxial layer 104. In order to reduce the footprint of the FET device 100 (in at least one dimension), it may be desirable to reduce the distance (i.e., indicated as N/P Distance on FIG. 1A) between the nFET active region 106 and the pFET active region 108. In FIG. 1A, this distance is indicated as N/P Distance, and is equal to X1+2*X2, where X1 represents a distance between the nFET contact 112 and the pFET contact 114, and where X2 represents a thickness of the respective epitaxial layer regions (i.e., the first epitaxial layer 102 and the second epitaxial layer 104) around the active regions (i.e., the nFET active region 106 and the pFET active region 108).

Figure 1B:
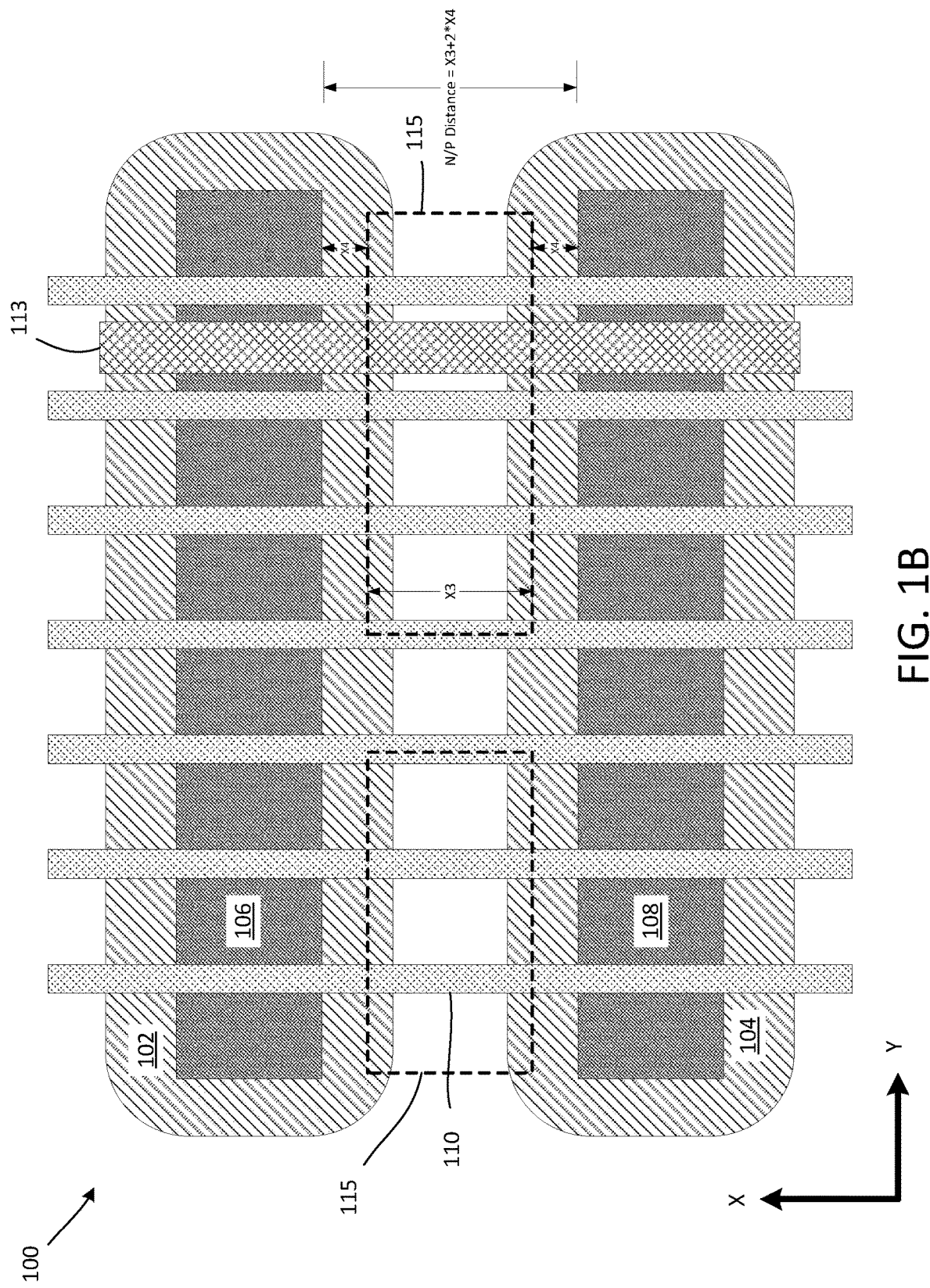
FIG. 1B is a plan view of the semiconductor FET device at an intermediate stage of a semiconductor fabrication process flow and having a reduced pitch between nFET and pFET regions relative to the device shown in FIG. 1A, according to embodiments.

Referring not to FIG. 1B, a plan view of the FET device 100 of FIG. 1A is shown, according to embodiments. As shown in FIG. 1B, a cut mask 115 area is shown, and represents an area where the device will be etched at a given stage of the manufacturing process. It should be noted that in FIG. 1B the contact 113 is shown in a pre-cut (or pre-etched) state, whereas in FIG. 1A, the contact is already cut into an nFET contact 112 and a pFET contact 114. In FIG. 2B, a smaller N/P Distance may be achieved relative to the device shown in FIG. 1A because X4<X2 and X3<X1. When the etching operation is applied to the FET device 100 using the cut mask 115, each of the contact 113, an interlayer dielectric (ILD) layer (see, FIG. 3B ILD layer 220), and the first and second epitaxial layers 102 and 104 are etched in a single manufacturing step. An etching composition may be suitably selected such that the contact 113, the ILD and first and second epitaxial layers 102 and 104 may be etched with etching selectivity relative to the gate electrode hardmask (see, FIG. 2A gate hardmask 208).

In certain embodiments, the dimension of X4 shown in FIG. 1B is less than the dimension of X2 shown in FIG. 1A because the etching cut is not made as a line end. Also, the dimension of X3 shown in FIG. 1B is less than the dimension of X1 shown in FIG. 1A because the first epitaxial layer 102 and the second epitaxial layer 104 are partially cut through (or removed). One effect of using a single cut mask 115 (i.e., rather than two or more) is that the contact 113 is self-aligned to the first epitaxial layer 102 and the second epitaxial layer 104 post etching operation. Another effect is that by using only one cut mask 115 (i.e., only one etching operation), the manufacturing efficiencies may be increased.

Figure 2A:
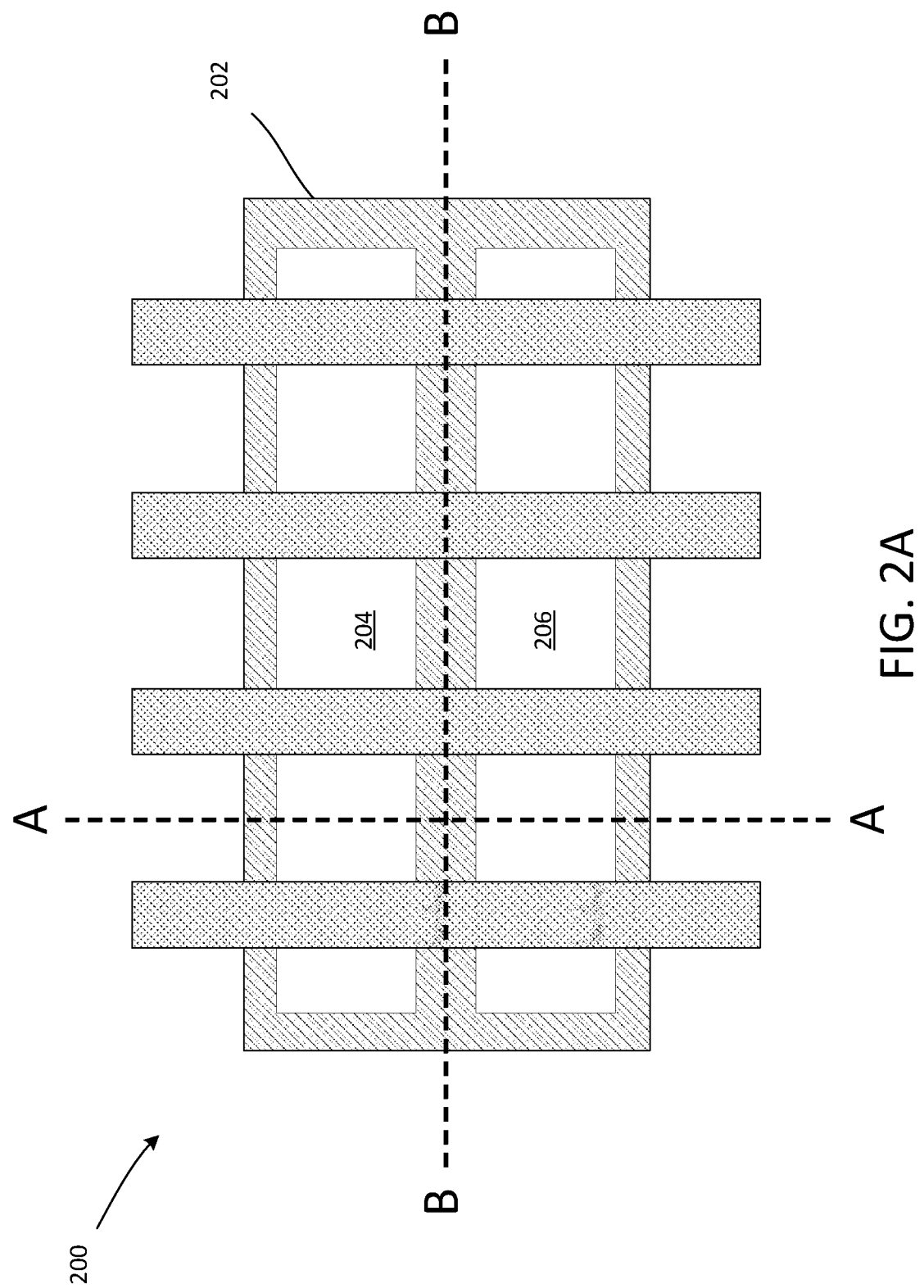
FIG. 2A is a plan view of a semiconductor FET device at an intermediate stage of a semiconductor fabrication process flow, according to embodiments.
Figure 2B:
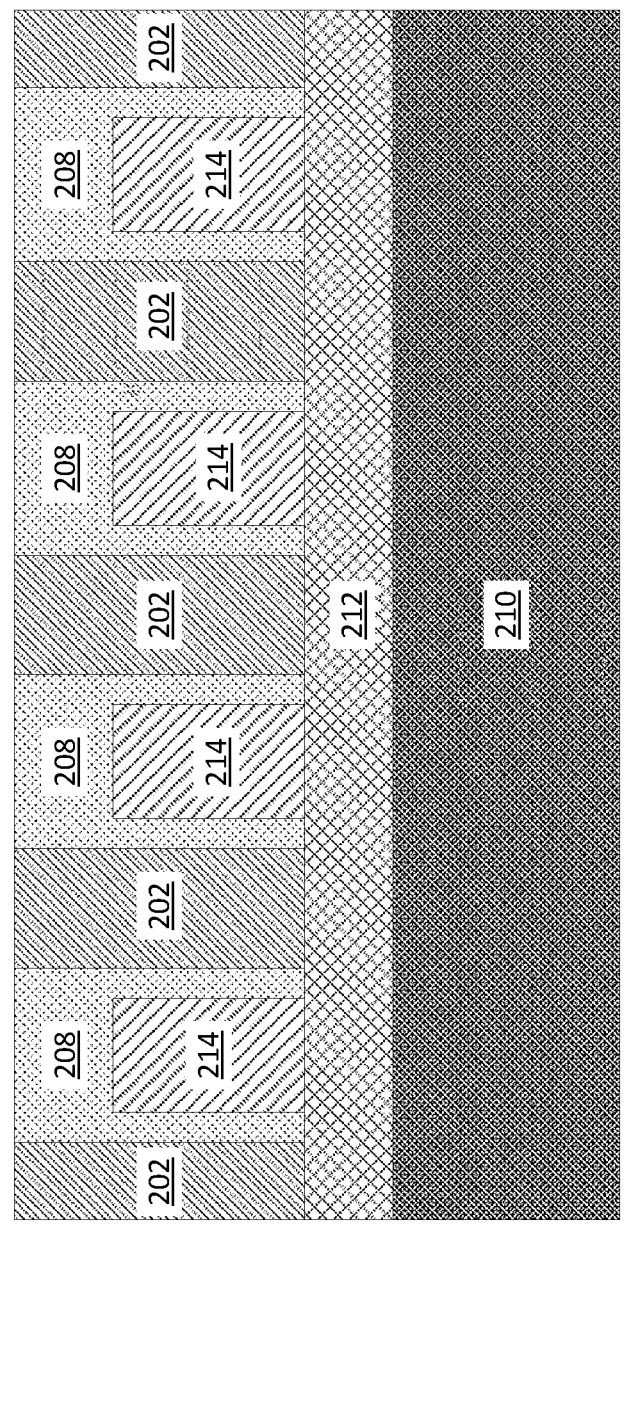
FIG. 2B is a cross-sectional view of the semiconductor FET device of FIG. 2A taken along line B-B, according to embodiments.
Figure 2C:
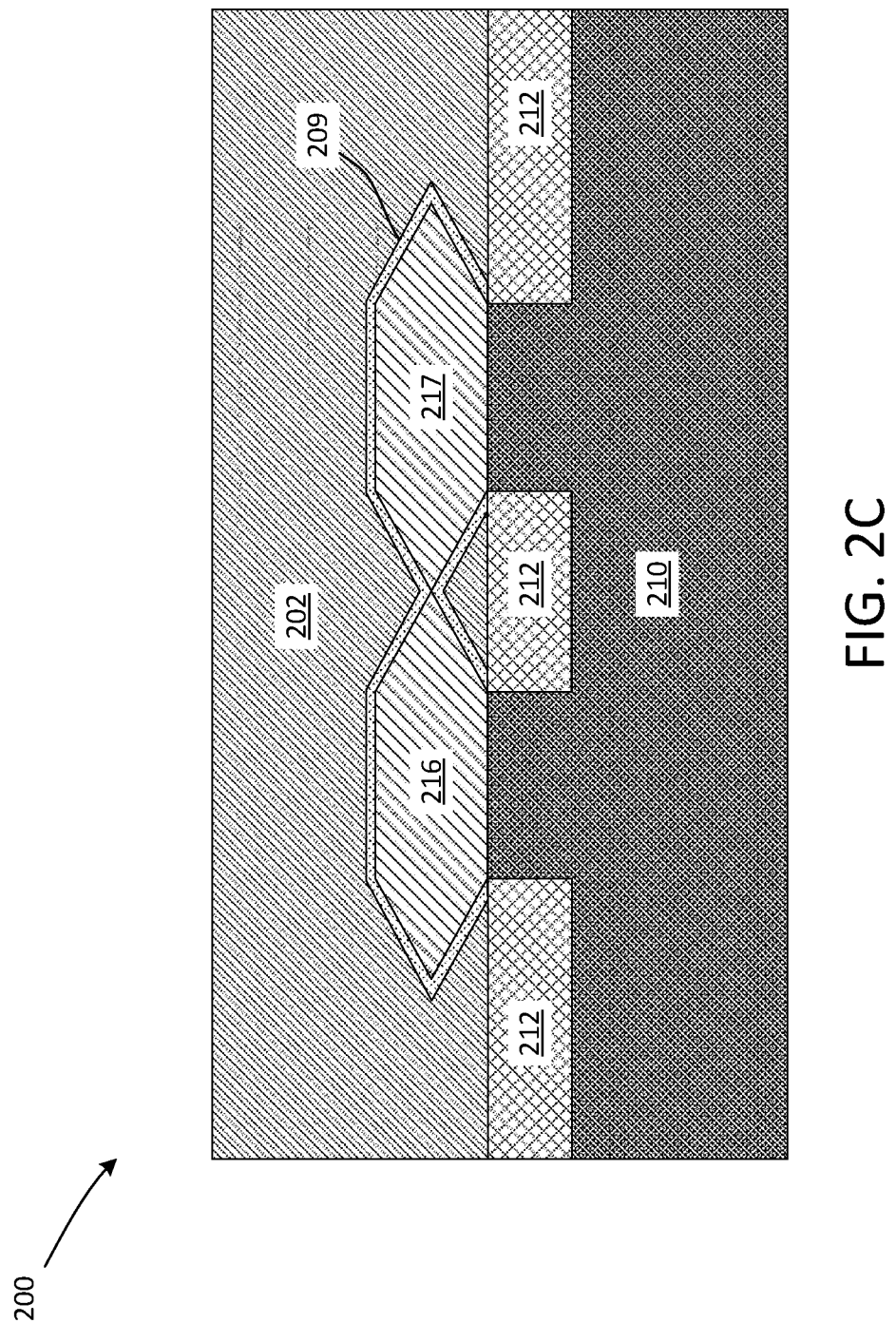
FIG. 2C is a cross-sectional view of the semiconductor FET device of FIG. 2A taken along line A-A, according to embodiments.

Referring now to FIGS. 2A-2C and initially to FIG. 2A, this figure shows a plan view of a semiconductor FET device 200 at an intermediate stage of a semiconductor fabrication process flow, according to embodiments. FIG. 2A shows the FET device 200 at, for example, after nFET and pFET epitaxial processes have been performed, and after a replacement metal gate (RMG) operation has been performed. As shown in FIG. 2B (which is a cross-sectional view of the semiconductor FET device of FIG. 2A taken along line B-B), a substrate 210 is provided and a shallow trench isolation (STI) region 212 can be formed between the nFET active region 204 (see, FIG. 2A) and the pFET active region 206 (see, FIG. 2A). The STI region 212 can separate the nFET source/drain region 216 (see, FIG. 2C, which is a cross-sectional view of the semiconductor FET device of FIG. 2A taken along line A-A) from the pFET source/drain region 217 (see, FIG. 2C). In certain embodiments, the pFET source/drain region includes a p-type work function (pWF) metal layer and the nFET source/drain region includes an n-type work function (nWF) metal layer. In general, shallow trench isolation (STI), also known as box isolation technique, is an integrated circuit feature which prevents electric current leakage between adjacent semiconductor device components. STI is generally used on CMOS process technology nodes of 250 nanometers and smaller. Referring again to FIG. 2B, a deposited layer 202 is provided over the STI region 212 and over the substrate 210. The deposited layer 202 may be an oxide material or any other suitable material.

Referring now to FIG. 2B, this figure is a cross-sectional view of the semiconductor FET device of FIG. 2A taken along line B-B, according to embodiments. As shown in FIG. 2B, gate electrodes 214 are formed, and a gate hardmask 208 is formed over the gate electrodes 214. The gate hardmask 208 is also shown in FIG. 2B. It should be appreciated that in certain embodiments, a chemical-mechanical planarization (CMP) process (or other planarization process) may be performed after the formation of the gate hardmask 208 and the deposited layer 202 such that the top surfaces of these layers are at least substantially coplanar. It is also understood that in certain cases the nFET source/drain 216 and the pFET source/drain 217 may be merged which is not shown in FIG. 2A and FIG. 2B.

As shown in FIG. 2B, the gate electrodes 214 are formed on the STI region 212, which is formed into the substrate 210. In certain embodiments, the gate hardmask 208 covers side surfaces and the top surface of the gate electrodes 214. In certain embodiments, the gate hardmask 208 may include one or more nitride based materials.

Referring now to FIG. 2C, this figure is a cross-sectional view of the semiconductor FET device 200 of FIG. 2A taken along line A-A, according to embodiments. As shown in FIG. 2C, the nitride liner layer 209 is formed to coat all exposed surfaces of the nFET source/drain region 216 and the pFET source/drain region 217. As also shown in FIG. 2C, the STI regions 212 are formed between the nFET source/drain region 216 and the pFET source/drain region 217. In certain embodiments, the nFET source/drain region 216 and the pFET source/drain region 217 are initially formed close to or in contact with each other. The close proximity or contact between the nFET source/drain region 216 and the pFET source/drain region 217 may allow for a smaller N/P Distance, as shown and described above with respect to FIG. 1B. This initial contact between the nFET source/drain region 216 and the pFET source/drain region 217 will be eliminated upon further processing steps, as described in further detail below.

Figure 3A:
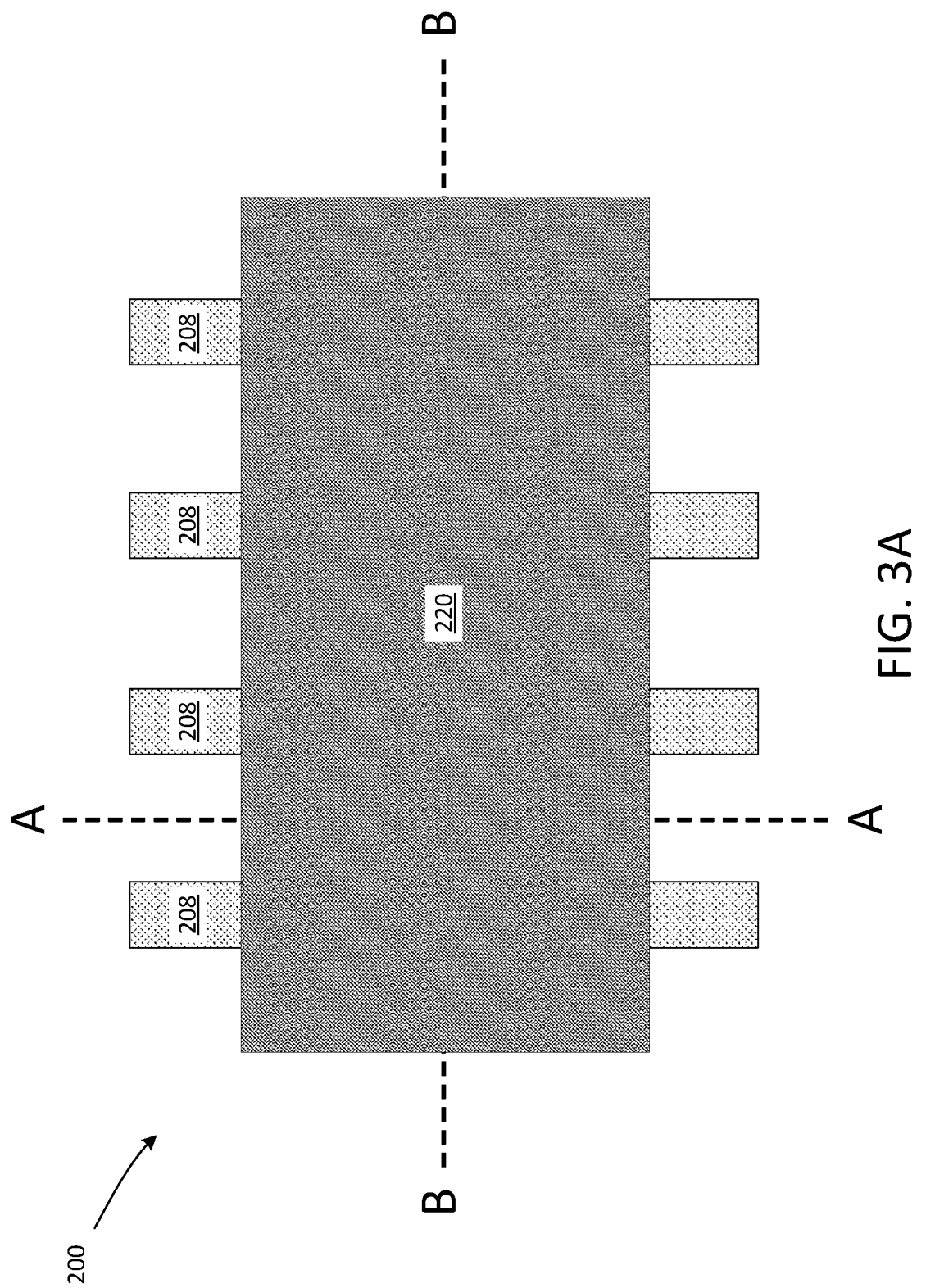
FIG. 3A is a plan view of the semiconductor FET device of FIG. 2A after additional fabrication operations, according to embodiments.
Figure 3B:
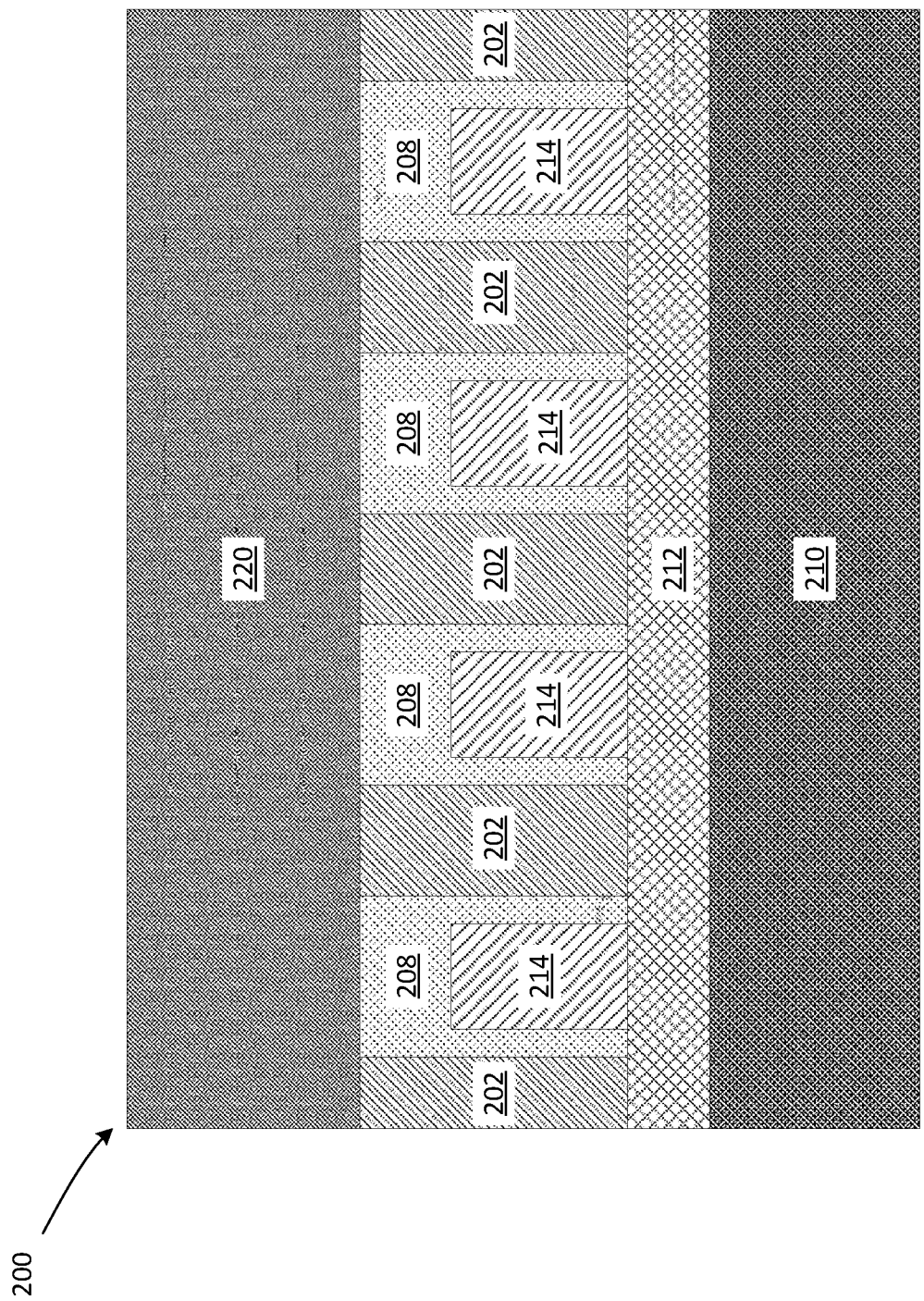
FIG. 3B is a cross-sectional view of the semiconductor FET device of FIG. 2A after additional fabrication operations and taken along line B-B, according to embodiments.
Figure 3C:
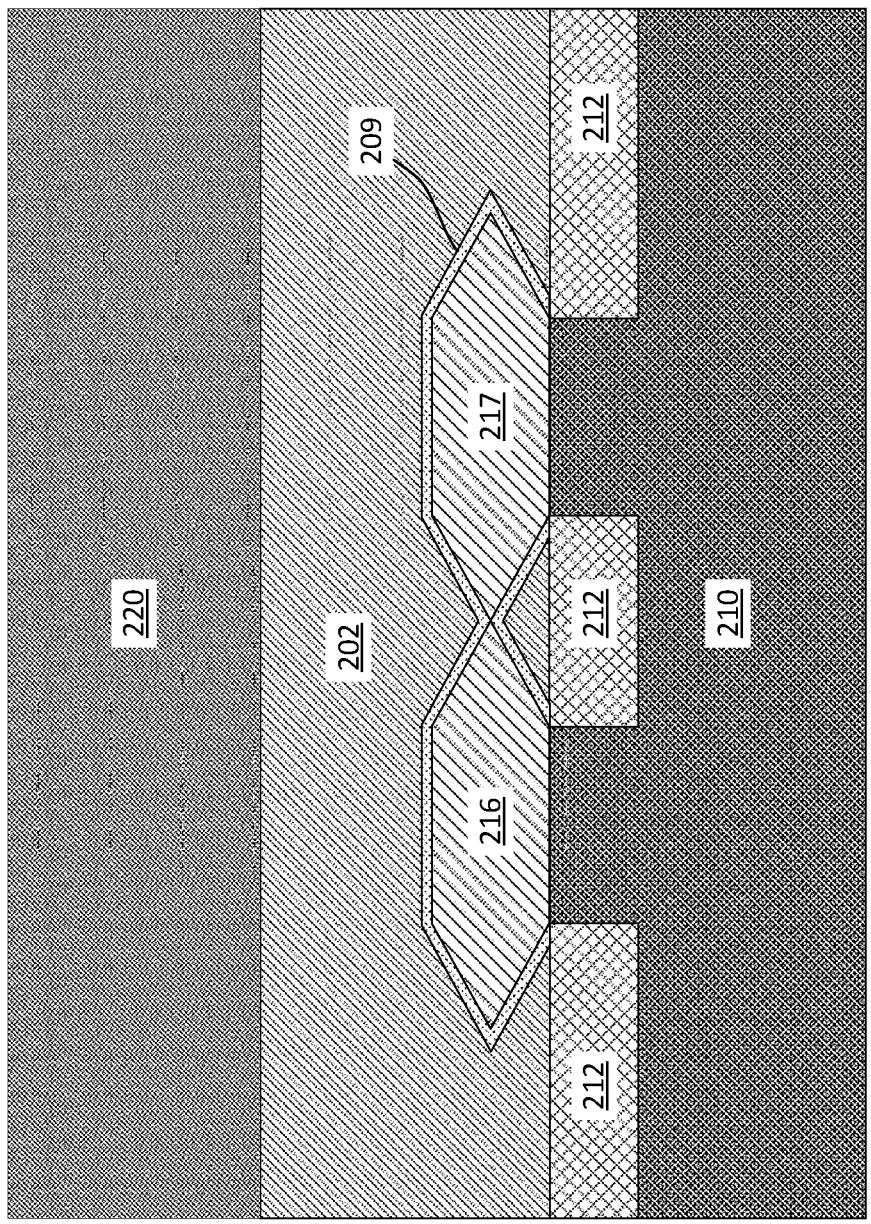
FIG. 3C is a cross-sectional view of the semiconductor FET device of FIG. 2A after additional fabrication operations and taken along line A-A, according to embodiments.

Referring now to FIGS. 3A-3C, this figure is a plan view of the semiconductor FET device 200 of FIG. 2A after additional fabrication operations, according to embodiments. As shown in FIGS. 3A-3C, an interlayer dielectric (ILD) layer 220 (or first insulator layer) is formed to cover the deposited layer 202 and the gate hardmask 208. As indicated above, FIG. 3B is a cross-sectional view of the semiconductor FET device of FIG. 2A after additional fabrication operations and taken along line B-B, and FIG. 3C is a cross-sectional view of the semiconductor FET device of FIG. 2A after additional fabrication operations and taken along line A-A, according to embodiments. It should be appreciated that any suitable material or materials may be used for the ILD layer 220.

Figure 4A:
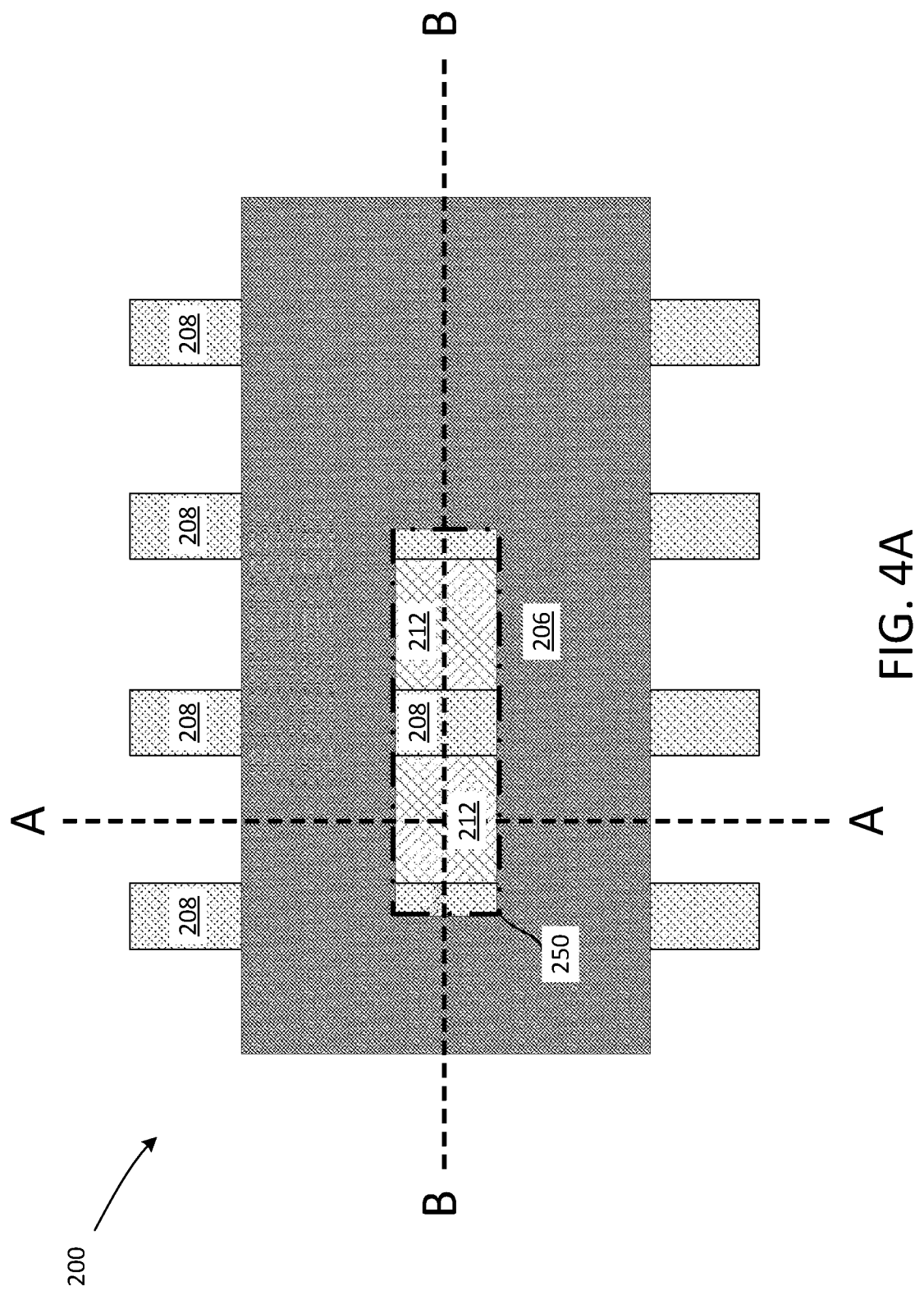
FIG. 4A is a plan view of the semiconductor FET device of FIG. 3A after additional fabrication operations, according to embodiments.
Figure 4B:
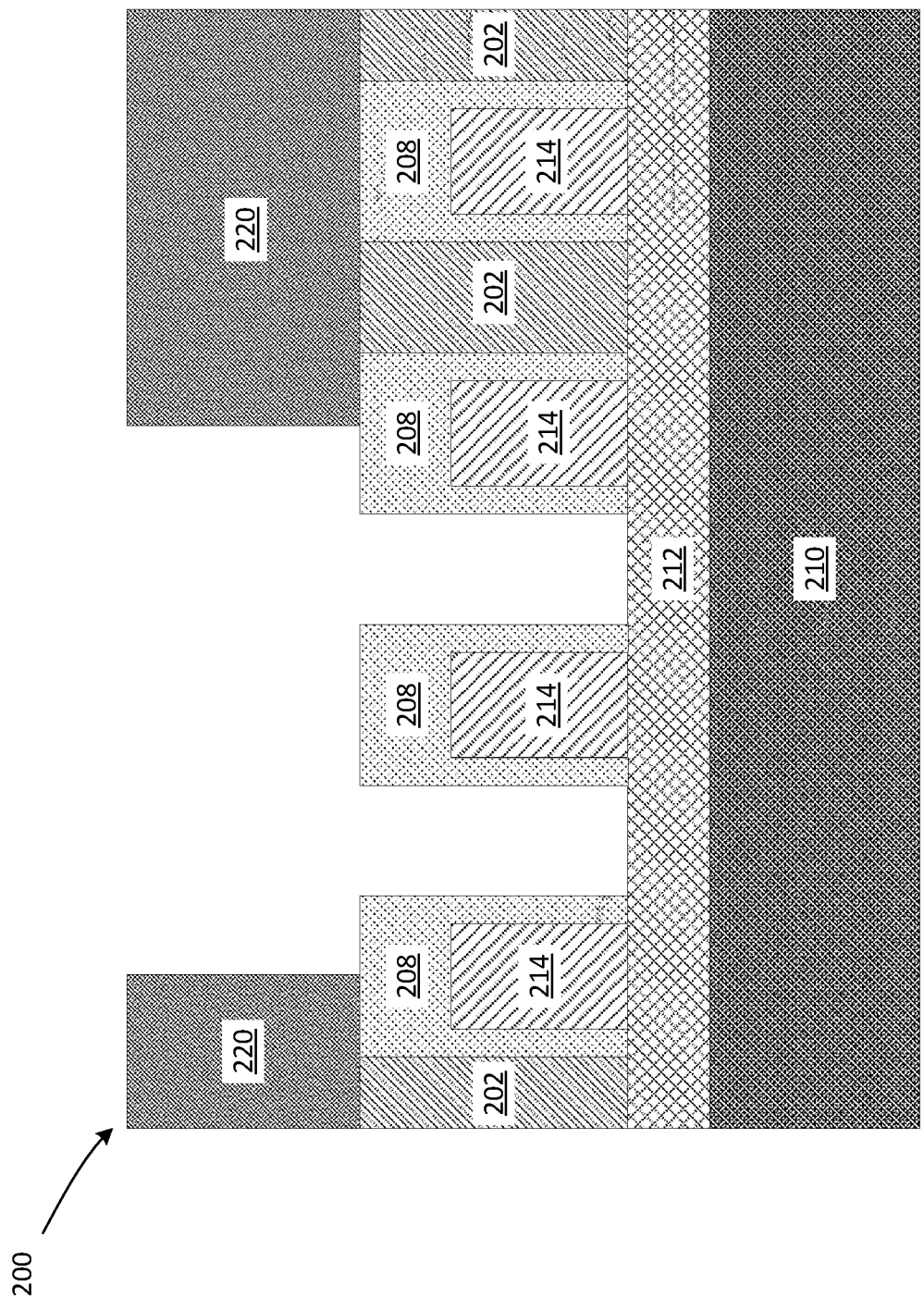
FIG. 4B is a cross-sectional view of the semiconductor FET device of FIG. 3A after additional fabrication operations and taken along line B-B, according to embodiments.
Figure 4C:
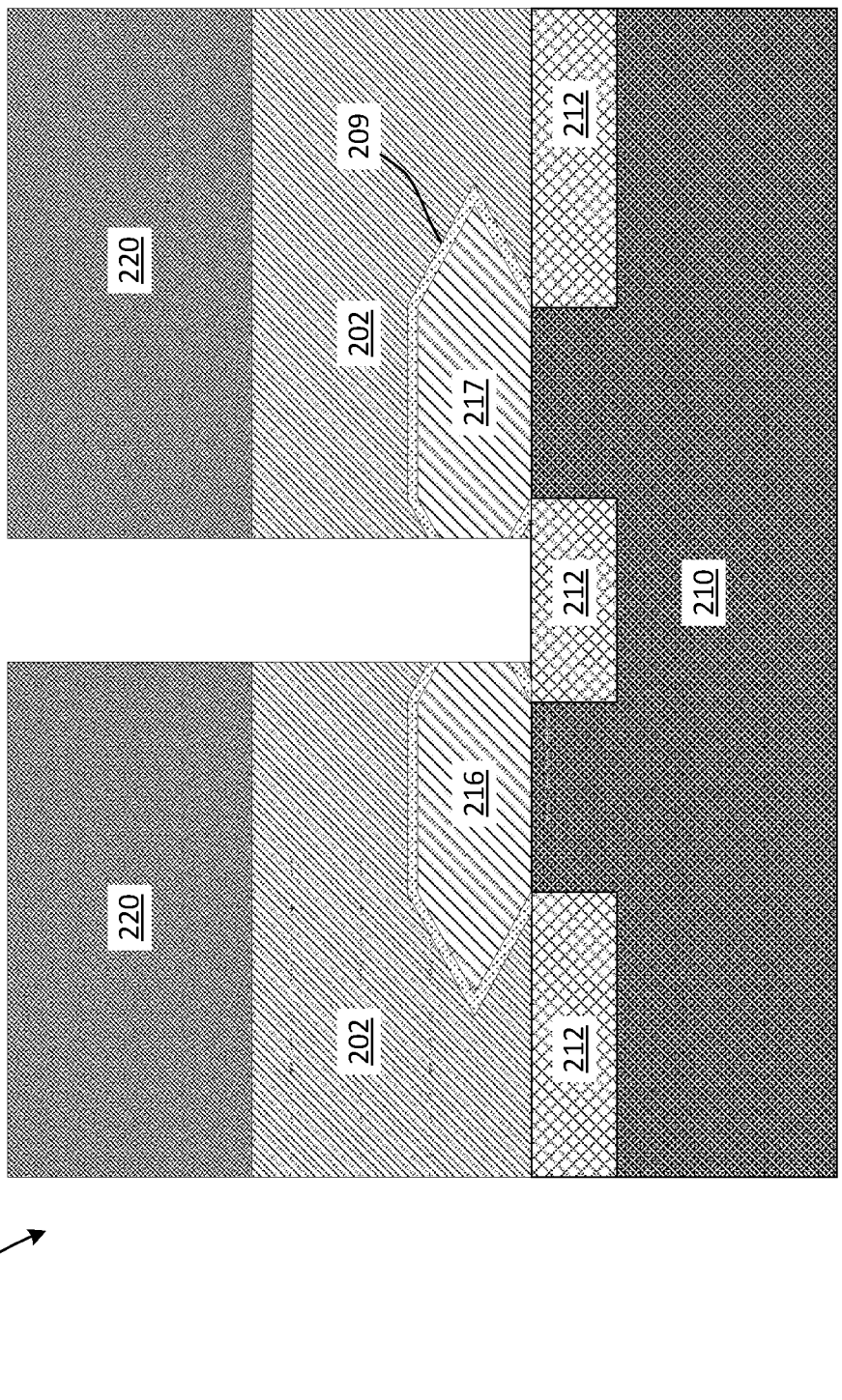
FIG. 4C is a cross-sectional view of the semiconductor FET device of FIG. 3A after additional fabrication operations and taken along line A-A, according to embodiments.

Referring now to FIGS. 4A-4C and initially to FIG. 4A, this figure is a plan view of the semiconductor FET device 200 of FIG. 3A after additional fabrication operations, according to embodiments. As shown in FIG. 4A, an etching operation (or other suitable material removal process known to a person of skill in the art) is performed on the FET device 200 with a mask, and the material is removed in the cut mask area 250. As shown in FIG. 4A, the material of both the ILD layer 220 and the deposited layer 202 is removed with a single mask and etch operation, thus exposing top surfaces of (or at least portions of the top surfaces of) the gate hardmask 208 and the underlying STI regions 212. As shown in FIGS. 4A and 4B, three different gate electrodes 214 are exposed (more specifically, the gate hardmask 208 covering the gate electrodes 214 are exposed) during the etching process, and the further gate electrode to the right 214 is not exposed. However, it should be appreciated that this is merely one example, and different numbers of gates may be exposed (or not exposed) depending on the connection requirements between the different transistors. As indicated above FIG. 4B is a cross-sectional view of the semiconductor FET device of FIG. 3A after additional fabrication operations and taken along line B-B.

Referring now to FIG. 4C, this figure is a cross-sectional view of the semiconductor FET device 200 of FIG. 3A after additional fabrication operations and taken along line A-A, according to embodiments. As shown in FIG. 4C, the etching operation also separates the nFET source/drain region 216 from the pFET source/drain region 217. As discussed above with regard to FIG. 2C, the nFET source/drain region 216 and the pFET source/drain region 217 are initially formed close to or in contact with each other in order to minimize the N/P Distance (or X3+2*X4 shown in FIG. 1B) to decrease the device footprint and to increase the density of the transistor array. Thus, there may be an effect that only one etching operation is required to separate the nFET source/drain region 216 from the pFET source/drain region 217, whereas related techniques may have the need to use additional cut masks and etching operations.

Figure 5A:
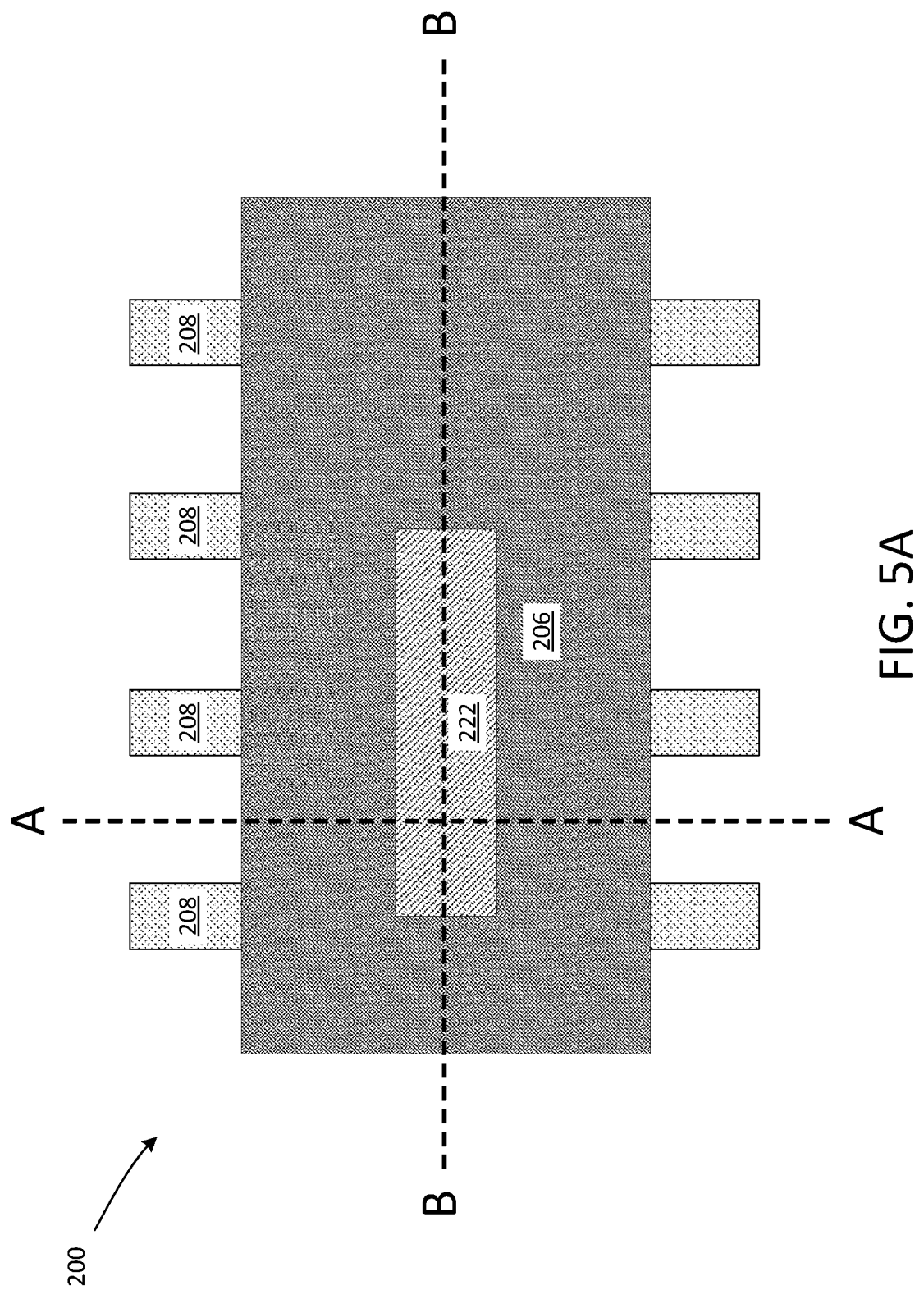
FIG. 5A is a plan view of the semiconductor FET device of FIG. 4A after additional fabrication operations, according to embodiments.
Figure 5B:
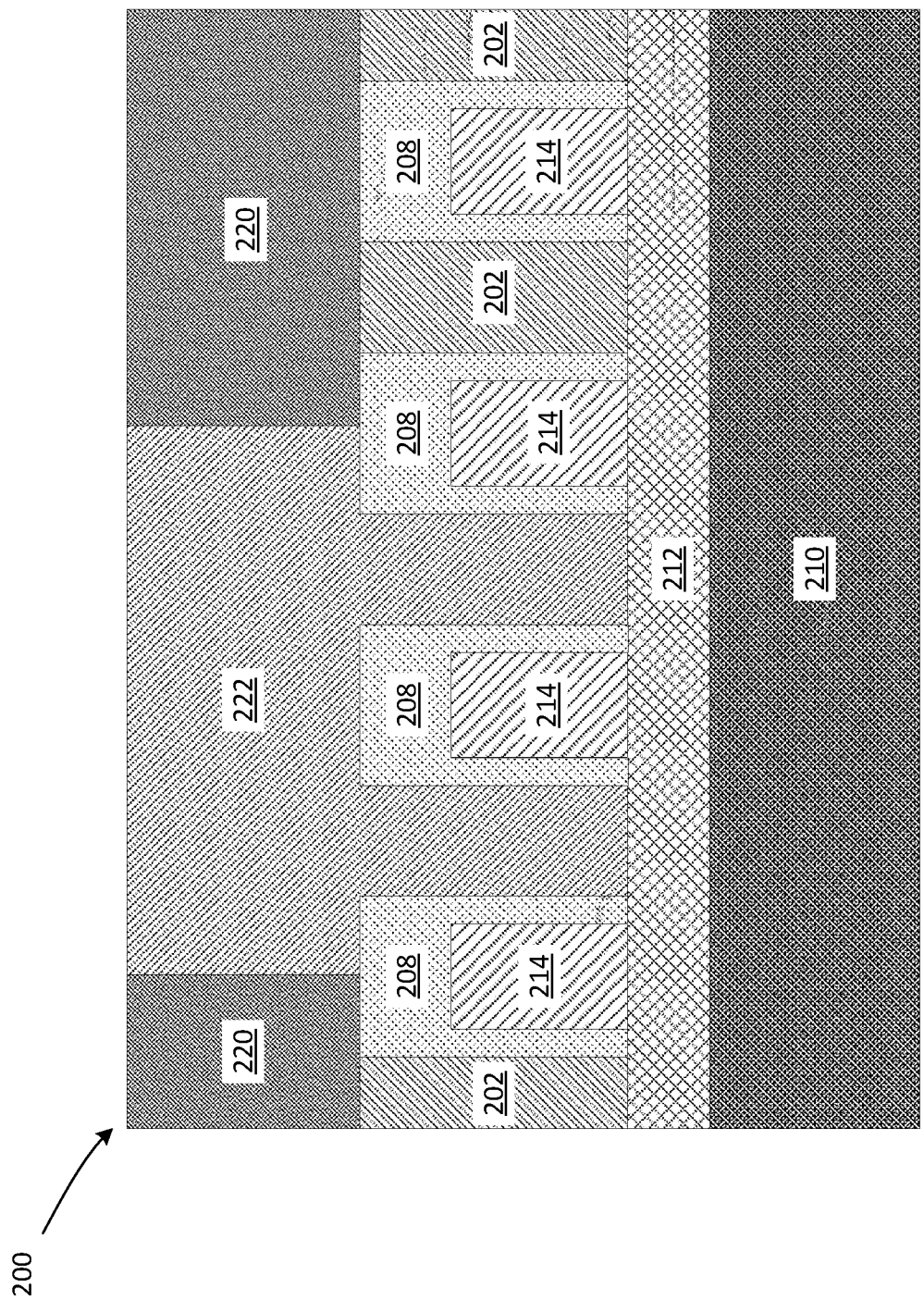
FIG. 5B is a cross-sectional view of the semiconductor FET device of FIG. 4A after additional fabrication operations and taken along line B-B, according to embodiments.
Figure 5C:
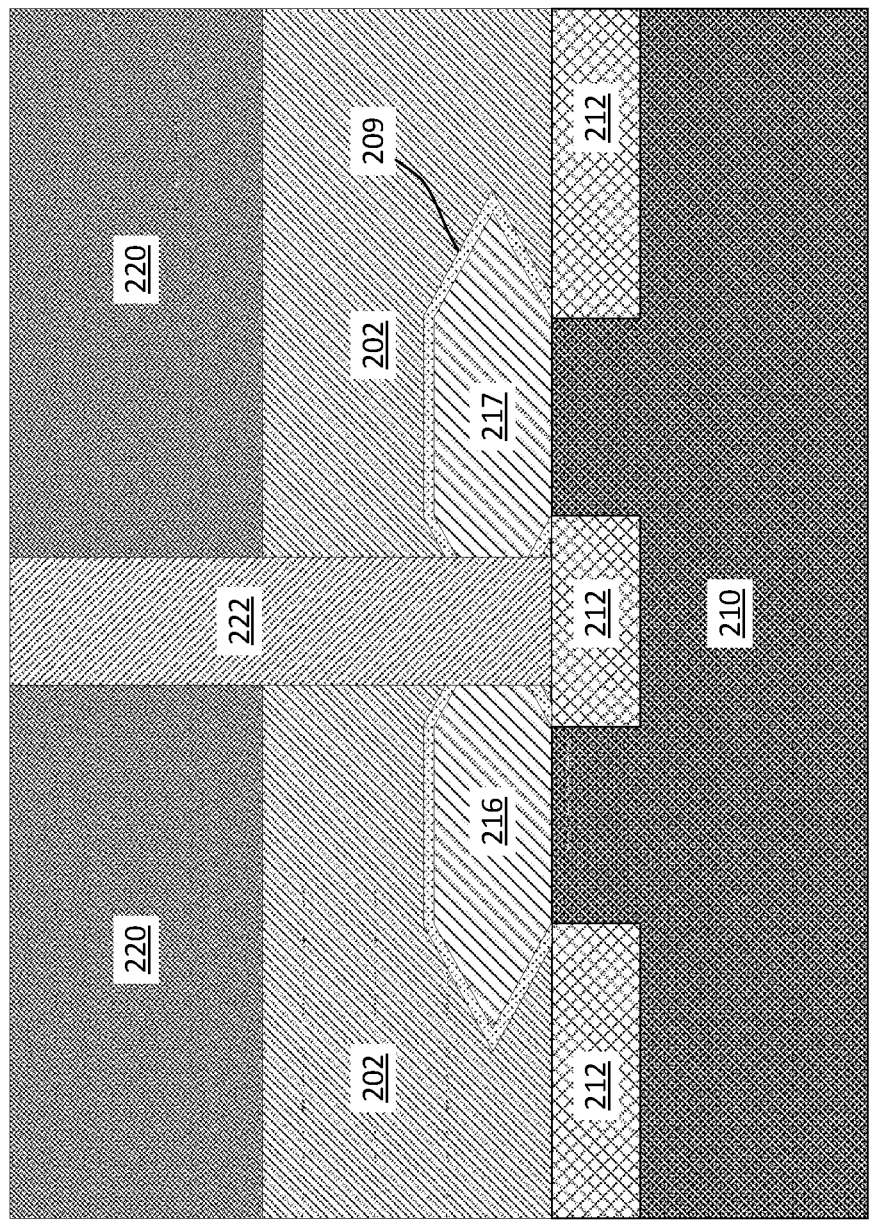
FIG. 5C is a cross-sectional view of the semiconductor FET device of FIG. 4A after additional fabrication operations and taken along line A-A, according to embodiments.

Referring now to FIGS. 5A-5C and initially to FIG. 5A is a plan view of the semiconductor FET device 200 of FIG. 4A after additional fabrication operations, according to embodiments. In FIG. 5A, a hardened insulator layer 222 (or second insulator layer) is provided to fill in the areas removed in the etching step described above with respect to FIGS. 4A-4C. FIG. 5B is a cross-sectional view of the semiconductor FET device of FIG. 4A taken along line B-B, and FIG. 5C is a cross-sectional view of the semiconductor FET device of FIG. 4A taken along line A-A. FIGS. 5B and 5C also show this hardened insulator layer 222. As shown in FIG. 5C, the hardened insulator layer 222 now covers the previously exposed side surfaces of the nFET source/drain region 216 and the pFET source/drain region 217, thus providing a new insulator material to separate these two regions. In certain embodiments, the material of the hardened insulator layer 222 may be one or more of BN, SiBN, $Al_2O_3$, AlN and HfO. In certain embodiments, this material of the hardened insulator layer 222 is a harder material than the material of the ILD layer 220. In certain embodiments, the hardened insulator layer 222 can be deposited and planarized using CMP.

Figure 6A:
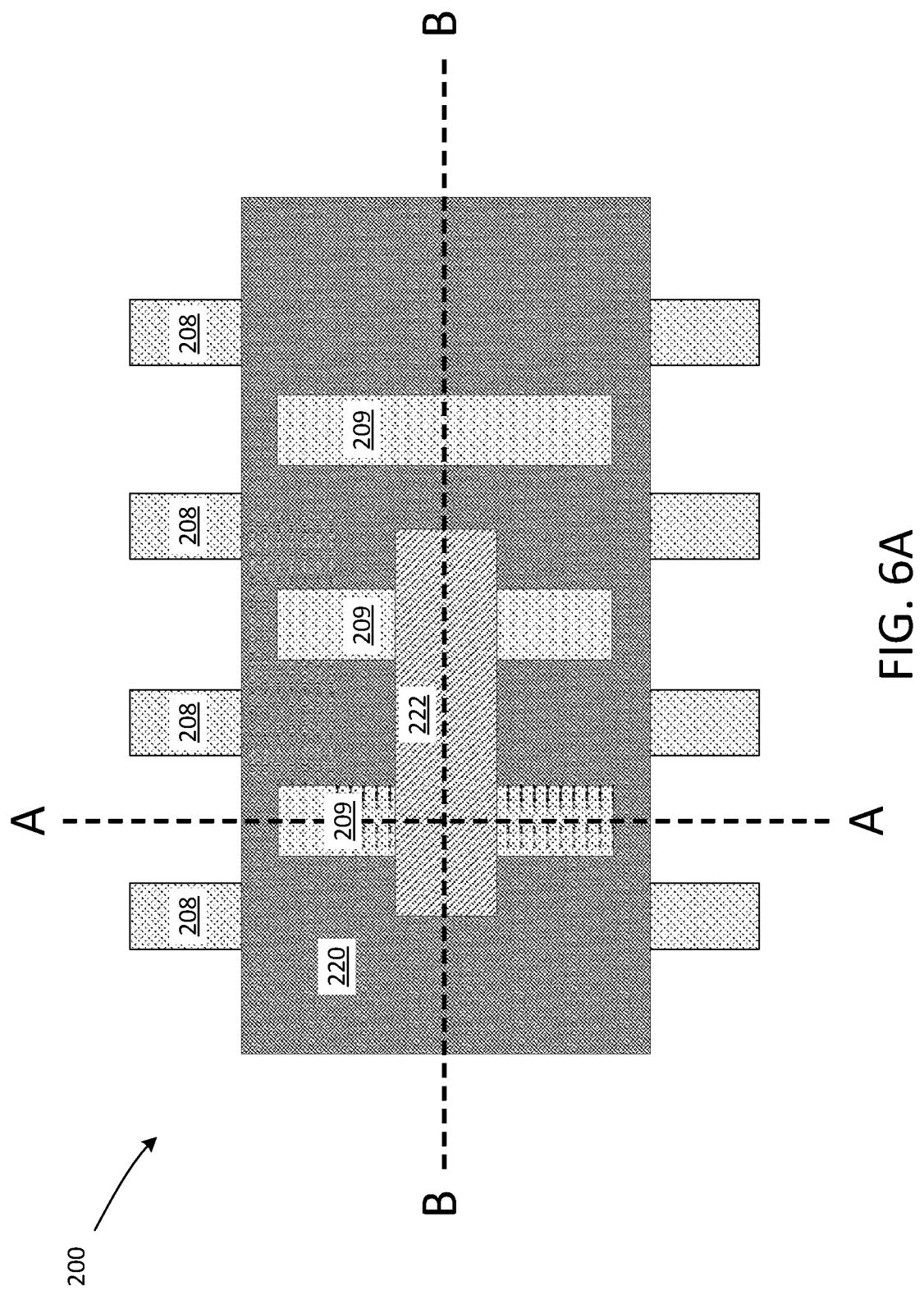
FIG. 6A is a plan view of the semiconductor FET device of FIG. 5A after additional fabrication operations, according to embodiments.
Figure 6B:
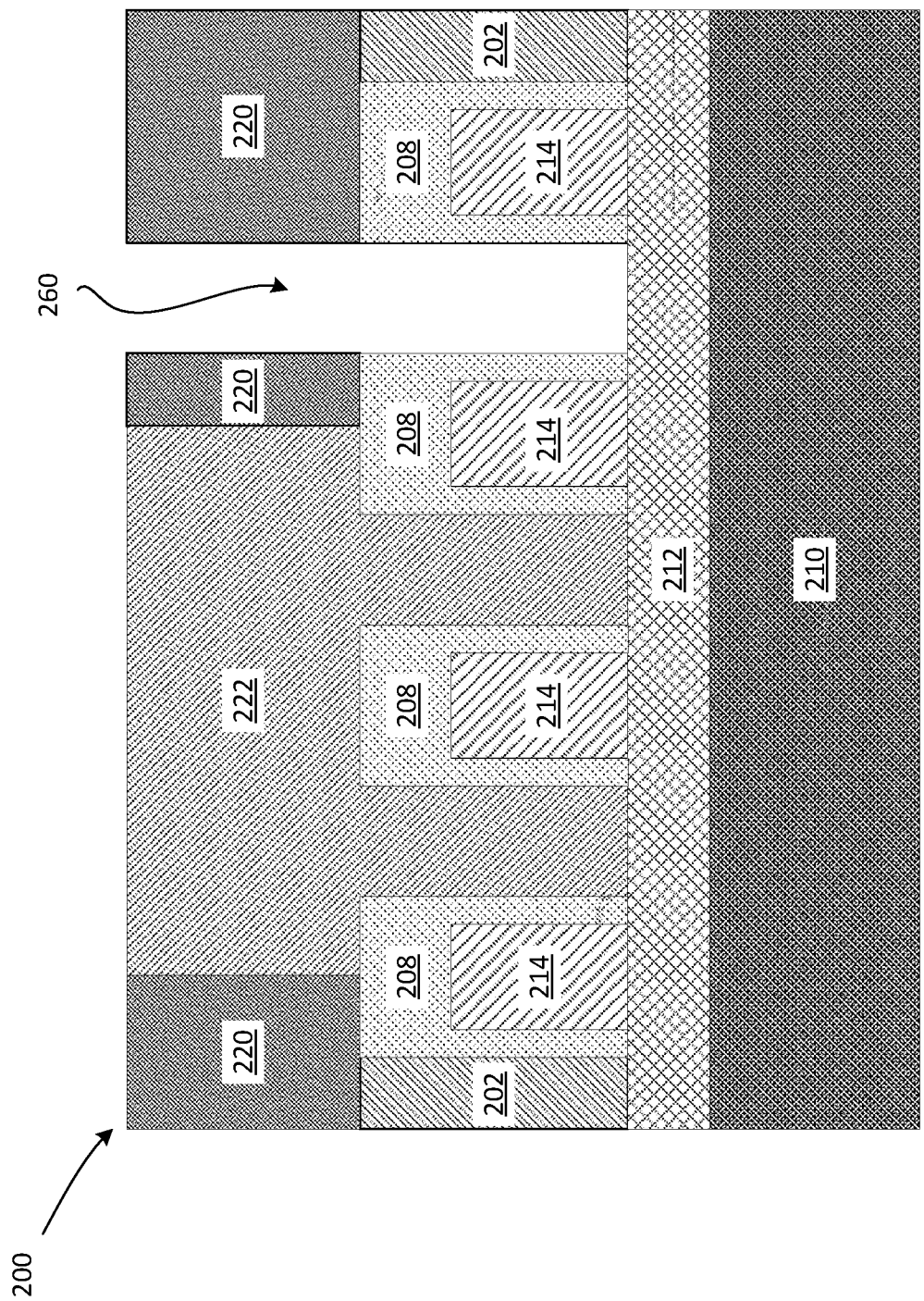
FIG. 6B is a cross-sectional view of the semiconductor FET device of FIG. 5A after additional fabrication operations and taken along line B-B, according to embodiments.
Figure 6C:
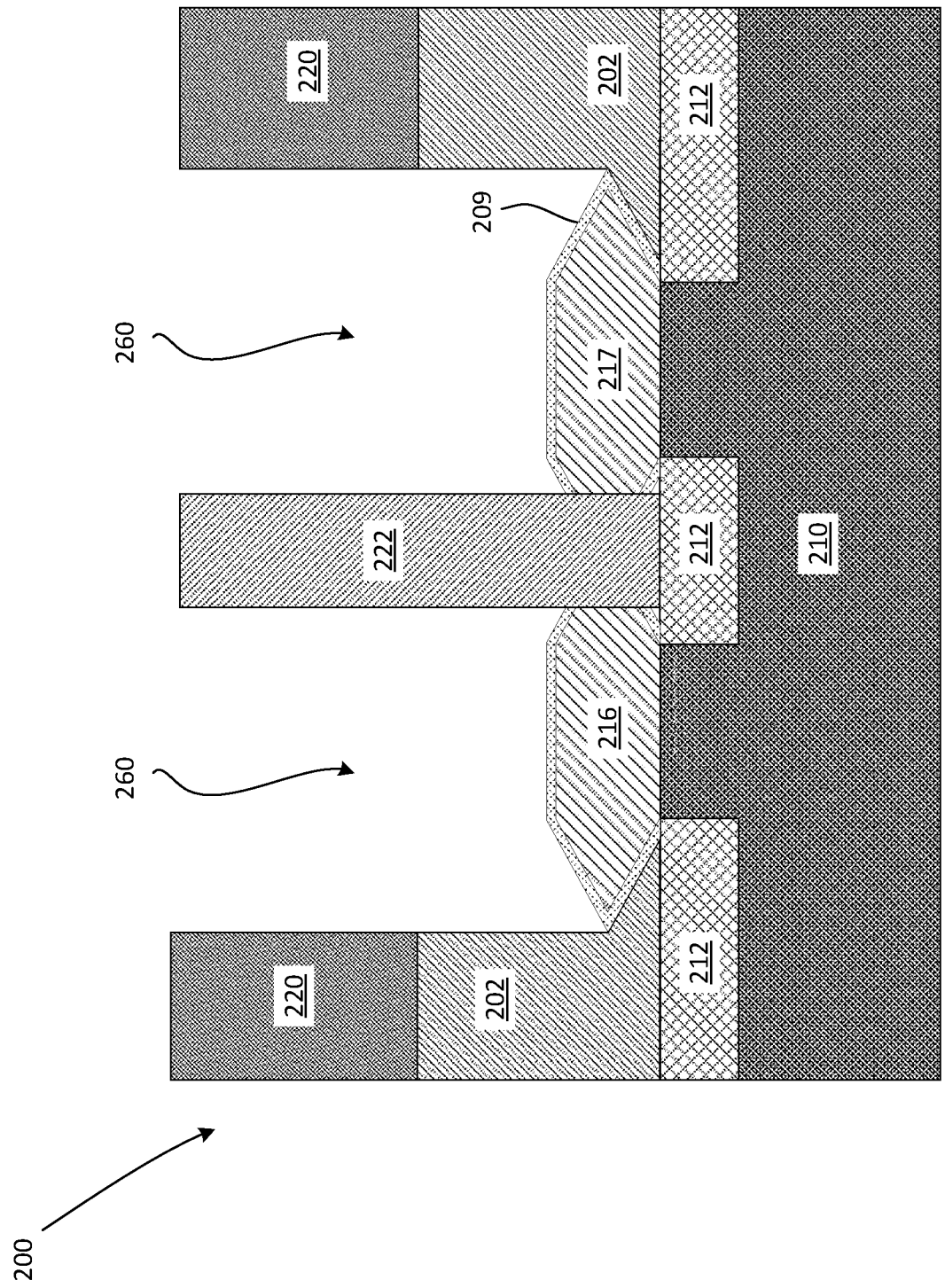
FIG. 6C is a cross-sectional view of the semiconductor FET device of FIG. 5A after additional fabrication operations and taken along line A-A, according to embodiments.

Referring now to FIGS. 6A-6C and initially to FIG. 6A, this figure is a plan view of the semiconductor FET device 200 of FIG. 5A after additional fabrication operations, according to embodiments. As shown in FIG. 6A, a contact lithography and etching process are performed to expose portions of the underlying nFET source/drain region 216 and the pFET source/drain region 217 (in particular, to expose the nitride liner layer 209 covering the nFET source/drain region 216 and the pFET source/drain region 217). FIG. 6B is a cross-sectional view of the semiconductor FET device of FIG. 5A taken along line B-B, and it is shown after the etching operation is performed, and in certain examples this leaves a space 260 between the two rightmost adjacent gate electrodes 214. FIG. 6C is a cross-sectional view of the semiconductor FET device of FIG. 5A taken along line A-A, and after the etching operation has been performed. As shown in FIG. 6C, the etching exposes the nitride liner layer 209 covering the nFET source/drain region 216 and the pFET source/drain region 217. In the example shown in FIG. 6A, there are three contact regions that are created by this etching step and that correspond to the three nitride liner layers 219. The left two contact regions (i.e., the left two nitride liner layers 219) in FIG. 6A traverse the hardened insulator layer 222, and the right contact region (i.e., the rightmost nitride layer 219) does not traverse a portion of the hardened insulator layer 222. In certain embodiments, the etchant for the material removal step shown in FIGS. 6A-6C has an etching selectivity for the ILD layer 220 and the deposited layer 202. Thus, this material is removed without removing the hardened insulator layer 222. As such, as shown in FIG. 6C, the sidewalls of the hardened insulator layer 222 are exposed.

Figure 7A:
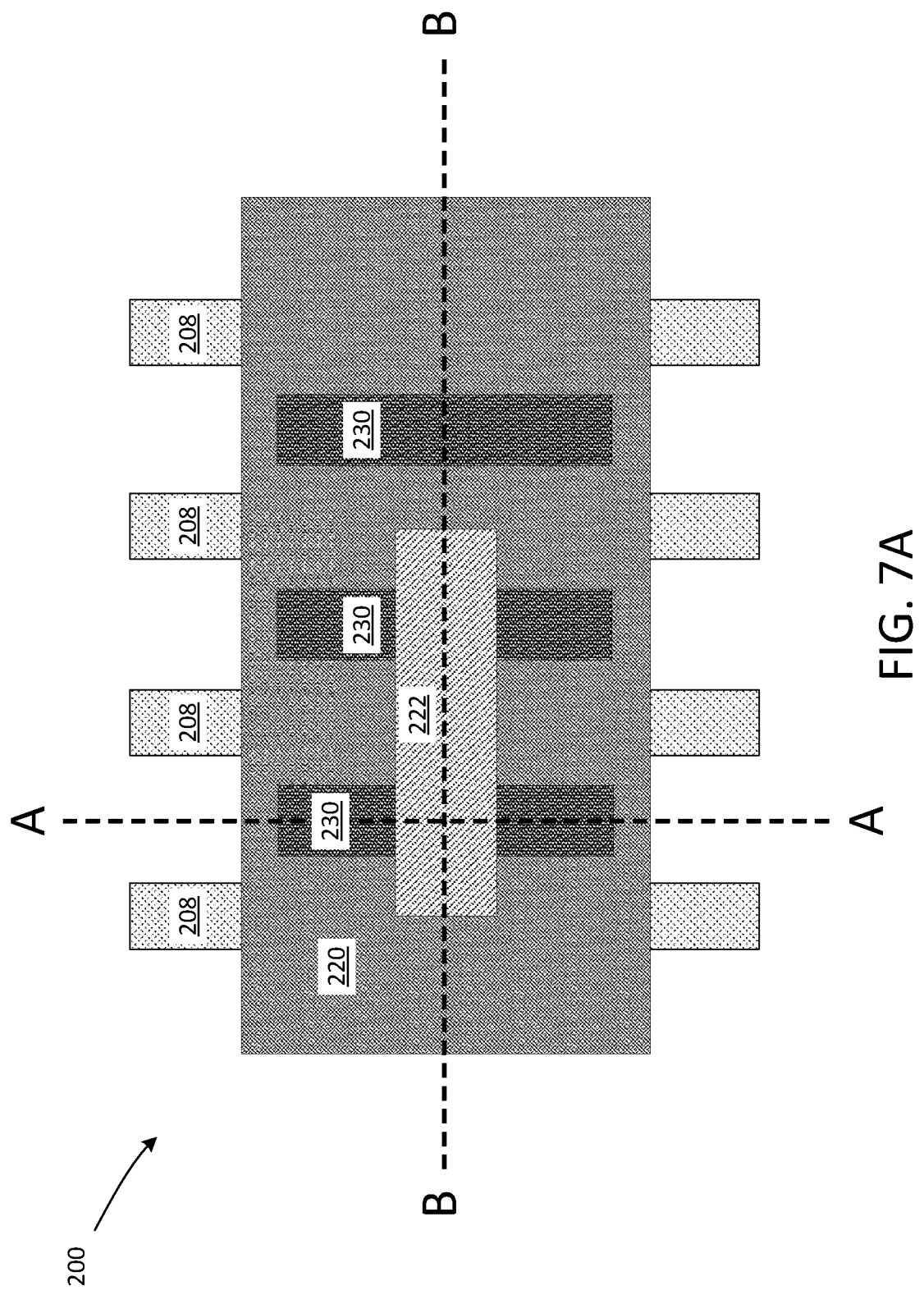
FIG. 7A is a plan view of the semiconductor FET device of FIG. 6A after additional fabrication operations, according to embodiments.
Figure 7B:
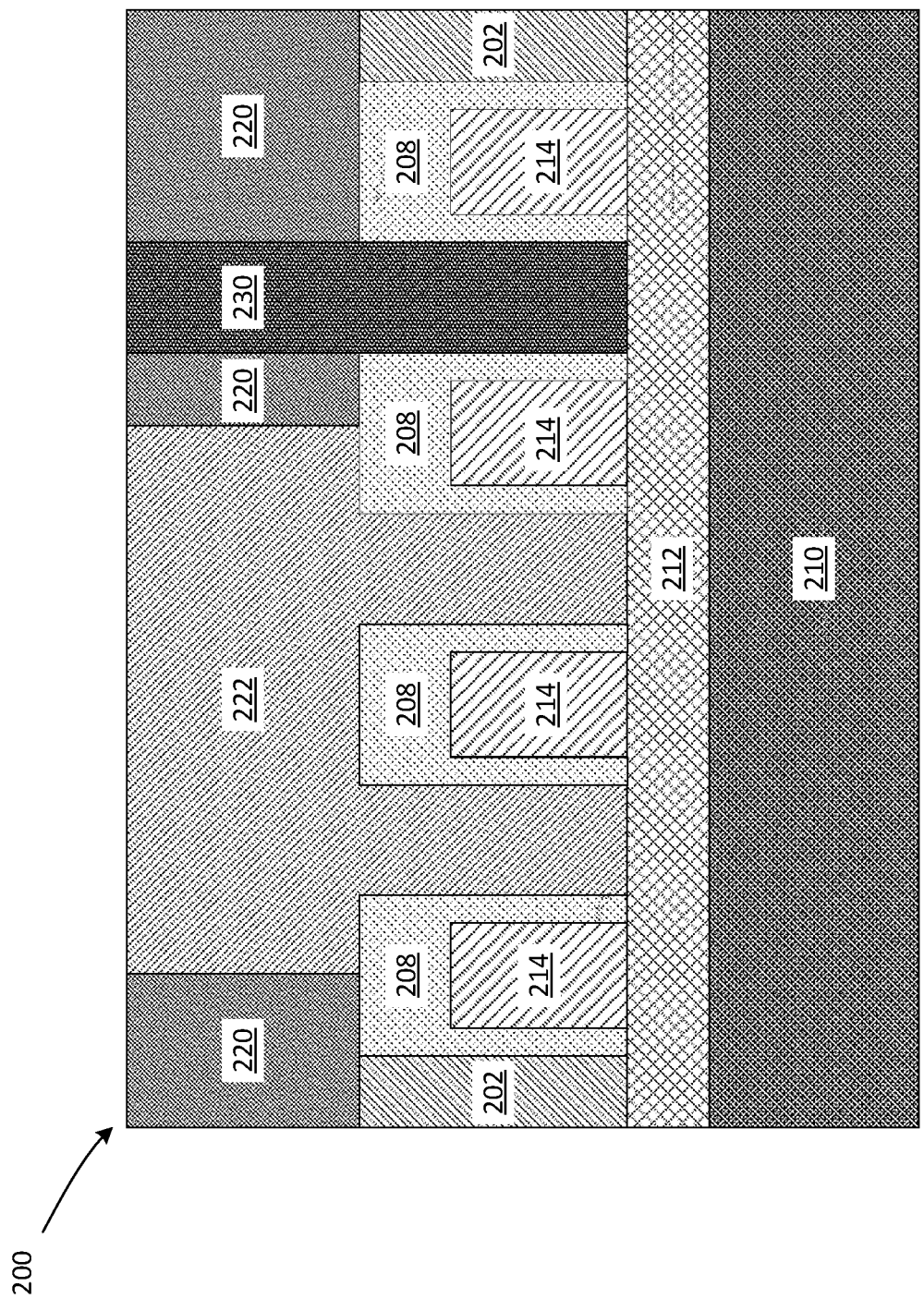
FIG. 7B is a cross-sectional view of the semiconductor FET device of FIG. 6A after additional fabrication operations and taken along line B-B, according to embodiments.
Figure 7C:
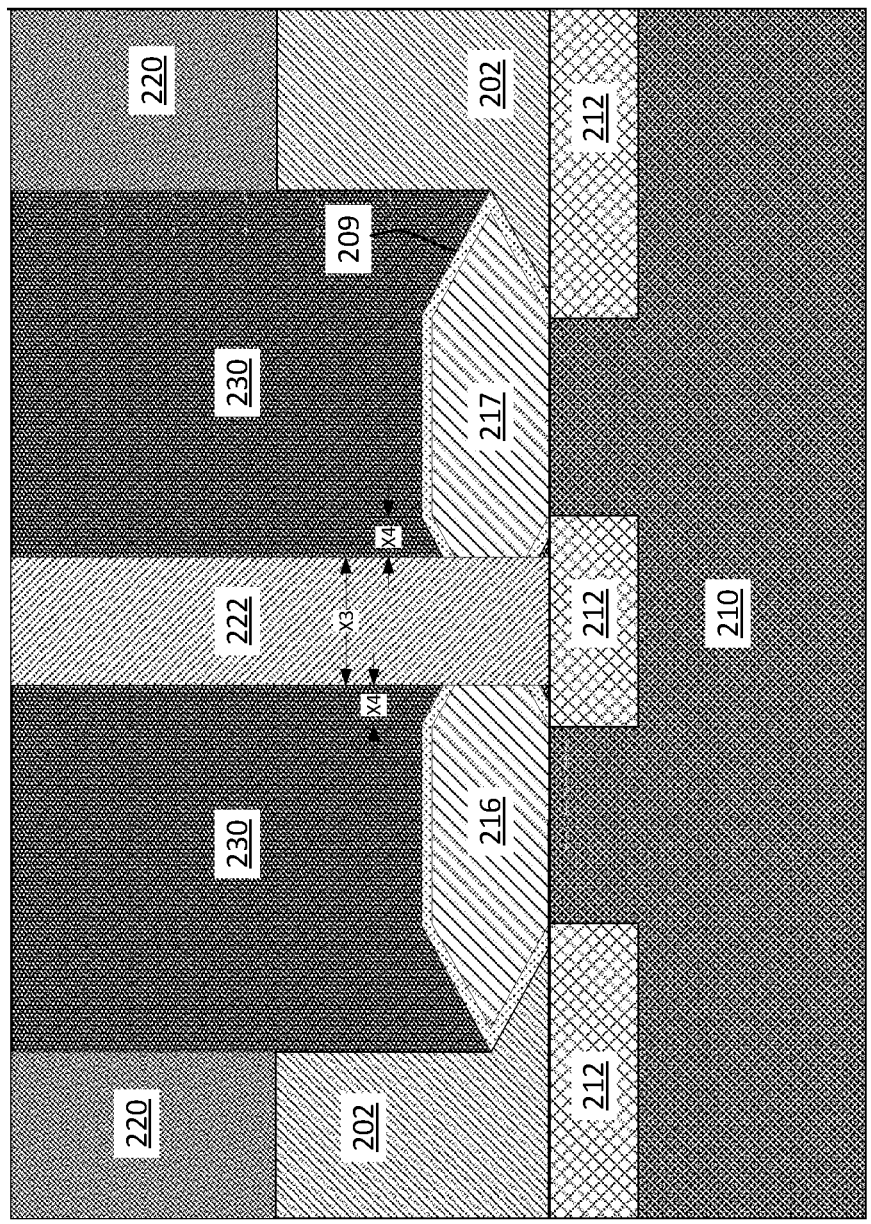
FIG. 7C is a cross-sectional view of the semiconductor FET device of FIG. 6A after additional fabrication operations and taken along line A-A, according to embodiments.

Referring now to FIGS. 7A-7C and initially to FIG. 7A, this figure is a plan view of the semiconductor FET device 200 of FIG. 6A after additional fabrication operations, according to embodiments. As shown in FIG. 7A, a contact metal 230 is deposited to fill in the spaces (i.e., spaces 260 shown in FIGS. 6B and 6C) formed in the etching step described above with respect to FIGS. 6A-6C. FIG. 7B is a cross-sectional view of the semiconductor FET device of FIG. 6A after additional fabrication operations and taken along line B-B, and FIG. 7C is a cross-sectional view of the semiconductor FET device of FIG. 6A after additional fabrication operations and taken along line A-A, according to embodiments. The contact metal 230 is also shown in the cross-sectional views of FIGS. 7B and 7C. In certain embodiments, a CMP process is performed on the FET device 200 to planarize the surface thereof. As shown in FIG. 7C the N/P Distance of X3+2*X4 corresponds generally to the same dimension shown in FIG. 1B. Thus, in certain embodiments, the dimension of X4 shown in FIG. 7C is less than the dimension of X2 shown in FIG. 1A because the etching cut is not made on a line end. Also, the dimension of X3 shown in FIG. 7C is less than the dimension of X1 shown in FIG. 1A because the deposited layer 202 and the ILD layer 220 are partially cut through (or removed). One effect of using a single cut mask (i.e., rather than two or more) is that the contact metal 230 is self-aligned to the deposited layer 202 and the ILD layer 220 post etching operation. Another effect is that by using only one cut mask (i.e., only one etching operation), the manufacturing efficiencies may be increased. Because the dimension X3 can be reduced related to other manufacturing techniques, the footprint of the FET device 200 may be decreased in at least one dimension and the device density may be increased (i.e., thus allowing more device to fit into a smaller area).

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A method of forming a field effect transistor (FET) device, the method comprising:
   providing a substrate;
   forming an nFET source/drain region on the substrate;

forming a pFET source/drain region on the substrate and adjacent to the nFET region, the nFET source/drain region directly contacting the pFET source/drain region;

forming a first insulator layer on the nFET source/drain region and the pFET source/drain region;

etching away a portion of the first insulator layer between the nFET source/drain region and the pFET source/drain region down to a level of the substrate, thereby breaking the contact between the nFET source/drain region and the pFET source/drain region;

forming a second insulator layer between the nFET source/drain region and the pFET source/drain region in a space formed by the etching, the second insulator layer extending from the substrate to a top of the first insulator layer, wherein a material of the second insulator layer is harder than a material of the first insulator layer.

2. The method according to claim 1, wherein the substrate includes at least one STI region between the nFET source/drain region and the pFET source/drain region.

3. The method according to claim 1, further comprising forming a contact metal on the nFET source/drain region and on the pFET source/drain region.

4. The method according to claim 1, further comprising forming a nitride liner layer on surfaces of the nFET source/drain region and the pFET source/drain region.

5. The method according to claim 1, wherein the second insulator layer comprises at least one material selected from a group consisting of BN, $Al_2O_3$, AlN and HfO.

6. The method according to claim 1, wherein the pFET source/drain region includes a pWF metal layer and the nFET source/drain region includes an nWF metal layer.

7. The method according to claim 1, further comprising forming a gate electrode.

8. The method according to claim 7, further comprising forming a gate hardmask on side surfaces and a top surface of the gate electrode.

9. The method according to claim 1, wherein the second insulator layer is formed in direct contact with sidewall portions of the nFET source/drain region and the pFET source/drain region.

10. The method according to claim 1, further comprising forming an epitaxial layer between the substrate and the first insulator layer.

11. A field effect transistor (FET) device comprising:
a substrate;
an nFET source/drain region formed on the substrate;
a pFET source/drain region formed on the substrate and adjacent to the nFET region;
a first insulator layer formed on sides of the nFET source/drain region and the pFET source/drain region; and
a second insulator layer formed between the nFET source/drain region and the pFET source/drain region, the second insulator layer extending from the substrate to a top of the first insulator layer,
wherein a material of the second insulator layer is harder than a material of the first insulator layer.

12. The FET device according to claim 11, wherein the substrate includes at least one STI region between the nFET source/drain region and the pFET source/drain region.

13. The FET device according to claim 11, further comprising a contact metal formed on the nFET source/drain region and on the pFET source/drain region.

14. The FET device according to claim 11, further comprising a nitride liner layer formed on surfaces of the nFET source/drain region and the pFET source/drain region.

15. The FET device according to claim 11, wherein the second insulator layer comprises at least one material selected from a group consisting of BN, $Al_2O_3$, AlN and HfO.

16. The FET device according to claim 11, wherein the pFET source/drain region includes a pWF metal layer and the nFET source/drain region includes an nWF metal layer.

17. The FET device according to claim 11, further comprising a gate electrode.

18. The FET device according to claim 17, further comprising a gate hardmask formed on side surfaces and a top surface of the gate electrode.

19. The FET device according to claim 11, wherein the second insulator layer is formed in direct contact with sidewall portions of the nFET source/drain region and the pFET source/drain region.

20. The FET device according to claim 11, further comprising an epitaxial layer formed between the substrate and the first insulator layer.

* * * * *